(12) United States Patent
Linares et al.

(10) Patent No.: US 6,965,959 B2
(45) Date of Patent: Nov. 15, 2005

(54) SYSTEM AND METHOD FOR INTRODUCING PROPRIETARY SIGNALS INTO A STANDARD BACKPLANE VIA PHYSICAL SEPARATION

(75) Inventors: Ignacio A. Linares, Plano, TX (US); Robert S. Gammenthaler, Jr., Frisco, TX (US); Gerald R. Dubois, Richardson, TX (US)

(73) Assignee: Alcatel, Paris (FR)

( * ) Notice: Subject to any disclaimer, the term of this patent is extended or adjusted under 35 U.S.C. 154(b) by 476 days.

(21) Appl. No.: 10/092,113

(22) Filed: Mar. 5, 2002

(65) Prior Publication Data

US 2003/0208648 A1 Nov. 6, 2003

(51) Int. Cl.[7] .............................. G06F 13/00; H05K 7/14
(52) U.S. Cl. ....................... 710/300; 710/305; 361/788; 439/572
(58) Field of Search ........................ 710/305, 300–303, 710/313; 439/78, 79, 445, 572; 326/62; 340/825; 370/464; 716/15; 174/52.1; 361/724, 748, 803, 788, 760; 333/260; 709/253

(56) References Cited

U.S. PATENT DOCUMENTS

| | | | |
|---|---|---|---|
| 5,122,691 A | * | 6/1992 | Balakrishnan ................ 326/86 |
| 5,308,926 A | | 5/1994 | Auerbuch et al. |
| 5,488,541 A | | 1/1996 | Mistry et al. |
| 5,541,586 A | * | 7/1996 | Wise ........................... 340/2.2 |
| 5,887,158 A | * | 3/1999 | Sample et al. ................. 716/15 |
| 6,282,599 B1 | * | 8/2001 | Gallick et al. ............... 710/306 |
| 6,356,966 B1 | * | 3/2002 | Loach et al. ................... 439/78 |
| 6,392,142 B1 | * | 5/2002 | Uzuka et al. ............... 174/52.1 |
| 6,418,026 B1 | * | 7/2002 | Ho et al. ...................... 361/727 |
| 6,425,027 B1 | * | 7/2002 | Mills et al. .................. 710/300 |

FOREIGN PATENT DOCUMENTS

GB          2354883 A          4/2001

OTHER PUBLICATIONS

"Face–Lock™ optical fiber connector design and fabrication" by Sheem, S.; Zhang, F.; Allen, E.; Lu, S.; Low, S. (abstract only) Publication Date: May 18–21, 1997.*

* cited by examiner

*Primary Examiner*—Gopal C. Ray
(74) *Attorney, Agent, or Firm*—Danamraj & Youst, P.C.; V. Lawrence Sewell

(57) ABSTRACT

A system and method for introducing user-defined (e.g., proprietary) signals into a standard backplane. A front side backplane portion is provided with a set of connector holes that are electrically separated from corresponding connector holes provided on the backplane's rear side portion. Thus, whereas the separated front side connector portion is operable with standard bus signals, the rear side connector portion can support an independent signal pathway to carry one or more user-defined signals.

10 Claims, 6 Drawing Sheets

SYSTEM AND METHOD FOR INTRODUCING PROPRIETARY SIGNALS INTO A STANDARD BACKPLANE VIA PHYSICAL SEPARATION

CROSS-REFERENCE TO RELATED APPLICATION(S)

This application discloses subject matter related to the subject matter disclosed in the following commonly owned co-pending patent application(s): (i) "Backplane System And Method For Introducing Non-Standard Signals," application Ser. No: 10/092,052, filed Mar. 5, 2002, in the names of: Ignacio A. Linares, Robert S. Gammenthaler Jr., and Gerald R. Dubois.

The following commonly owned patent application is hereby incorporated by reference herein for all purposes: "Clock Distribution Scheme In A Signaling Server," application Ser. No.: 09/541,002, filed Mar. 31, 2000, in the name(s) of: Val Teodorescu, now U.S. Pat. No. 6,643,791 issued Nov. 4, 2003.

BACKGROUND OF THE INVENTION

1. Technical Field of the Invention

The present invention generally relates to backplane technologies. More particularly, and not by way of any limitation, the present invention is directed to a system and method for introducing proprietary signals into a standard backplane.

2. Description of Related Art

The exponential increase in the number of local telephone lines, mobile subscribers, pages, fax machines, and other data devices, e.g., computers, Information Appliances, etc., coupled with deregulation that is occurring worldwide today is driving demand for small form factor, high capacity switching nodes (e.g., Signal Transfer Points or STPs) which must be easy to maintain, provide full SS7 functionality with so-called "five nines" operational availability (i.e., 99.999% uptime), and provide the capability to support future functionality or features as the need arises. Further, as subscriber demand for more service options proliferates, an evolution is taking place in the telecommunications industry to integrate Intelligent Network (IN)-capable Service Control Point (SCP) functionality within STP nodes to give rise to what are known as "signaling server" nodes that have integrated or hybrid functionality.

Additionally, coupled with the phenomenal popularity of the Internet, there has been a tremendous interest in using the packet-switched network (PSN) infrastructure employed in the data networks (e.g., those based on Internet Protocol (IP) addressing) as a replacement for, and/or as an adjunct to, the existing circuit-switched network (CSN) infrastructure deployed in today's voice networks. Several advantages are expected to be realized due to such integration. From network operators' viewpoint, the inherent traffic aggregation in PSN allows for a reduction in the cost of transmission and the infrastructure cost per end-user. Ultimately, such cost reductions enable the network operators to pass on the savings to subscribers. Also, operators of a new breed of service-centric networks (collectively referred to as the Next-Generation Network or NGN infrastructure, distinct from the existing voice-centric and data-centric networks) can offer enhanced services with integrated voice/data/video to subscribers who will be using endpoints of diverse multimedia capabilities.

While it is generally expected that a single platform that supports large-database, high-transaction IN services as well as high-capacity packet switching will reduce equipment costs, reduce network facility costs and other associated costs while increasing economic efficiency, those skilled in the art should recognize that several difficulties must be overcome in order to integrate the requisite functionalities into a suitable network element that satisfies the stringent performance criteria required of carrier-class, telecom-hardened network equipment. Daunting challenges arise in designing a compact enough form factor that is efficiently scalable, ruggedized, and modularized for easy maintenance, yet must house an extraordinary array of complex electronic circuitry, e.g., processors, control components, timing modules, I/O, line interface cards which couple to telephony networks, etc., that is typically required for achieving the necessary network element functionality. Whereas the electronic components may themselves be miniaturized and modularized into cards or boards that can be interconnected, supporting the requisite functionality within a stringent form factor on a backplane poses many obstacles.

Advances in backplane technology have accordingly become very important in the context of today's telecommunications network equipment. Clearly, providing a standardized backplane with a rugged form factor and connectorization, including a standard bus path across the backplane, is critical to the overall equipment design. Additionally, such standardization is necessary for ensuring interoperability of off-the-shelf components developed by third-party suppliers.

Whereas the emergence of standards-compliant backplanes and associated bus technologies (e.g., the Compact Peripheral Component Interconnect (CPCI) bus standard) has been laudatory, the need for continuous improvement nevertheless remains in this important field. For example, current standard backplanes support only a limited number of signal pathways that span the entire backplane and these signal pathways (collectively, the bus) are typically confined to carrying standards-compliant bus signals to the various cards connected thereto. However, it should be apparent to those skilled in the art that in many applications it may be desirable and/or necessary to increase the number of such pathways so that additional signals (e.g., application-specific control signals) may be carried thereon across the backplane. Further, such a solution for providing the carrying capacity for additional signals should not so interfere with the bus standard employed that it effectively precludes interoperability with the compliant off-the-shelf cards.

SUMMARY OF THE INVENTION

Accordingly, the present invention advantageously provides an innovative solution for introducing user-defined (e.g., proprietary) signals into a standard backplane such as a CPCI-compliant backplane without sacrificing compliance requirements or negatively interfering with the use of third-party card components. A front side backplane portion is provided with a set of connector holes that are electrically separated from corresponding connector holes provided on the backplane's rear side portion. Thus, whereas the separated front side connector portion is operable with standard bus signals (e.g., CPCI signals), the corresponding rear side connector portion can support an independent signal pathway to carry one or more user-defined signals.

In one aspect, the present invention is directed to a backplane that supports proprietary signals in addition to standards-compliant signals. A front side portion of the backplane is provided with a plurality of front connector holes organized into a set of front connector segments. The backplane's rear side portion is provided with a plurality of rear connector holes organized into a set of rear connector segments that correspond to the front connector segments. In a presently preferred exemplary embodiment, the front connector holes of at least one front connector segment and the rear connector holes of a rear connector segment that corresponds to the selected front connector segment are dimensioned such that the front connector segment and its corresponding rear connector segment are electrically separated, whereby the selected front connector segment and the corresponding rear connector segment are operable to support independent signal pathways.

In another aspect, the present invention is directed to a method for introducing user-defined signals into a CPCI-compliant backplane, comprising the following steps: providing a front side portion of the backplane with a plurality of front connector holes that are organized into a set of front connector segments; providing a rear side portion of the backplane with a plurality of rear connector holes that are organized into a set of rear connector segments that correspond to the front connector segments; and providing an electrical and physical separation between front connector holes of at least one front connector segment and rear connector holes of a rear connector segment that corresponds to at least one front connector segment, whereby the front connector segment is operable to support a CPCI-compliant bus for carrying CPCI signals and the corresponding rear connector segment is operable to support an independent signal pathway for carrying at least one user-defined signal.

In a further aspect, the present invention is directed to a connector system that includes a CPCI-compliant backplane having a plurality of slots. Each slot includes five front side connector segments (denoted herein as P1 through P5) and five rear side connector segments (denoted herein as rP1 through rP5) that correspond to the front side connector segments. In accordance with the features of an exemplary implementation, the connector holes forming the P1 and P2 connector segments are electrically and physically separated from the connector holes forming the rP1 and rP2 connector segments. A front side card is coupled to the backplane at a particular slot, wherein the front side card is operable to carry a plurality of CPCI signals via a front side backplane bus formed to couple the P1 and P2 connector segments of the slots. A rear side card is coupled to the backplane at the particular slot's rear side connector segments, wherein the rear side card is operable to carry at least one user-defined signal via a rear side backplane bus formed to couple the rP1 and rP2 segments of the slots.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
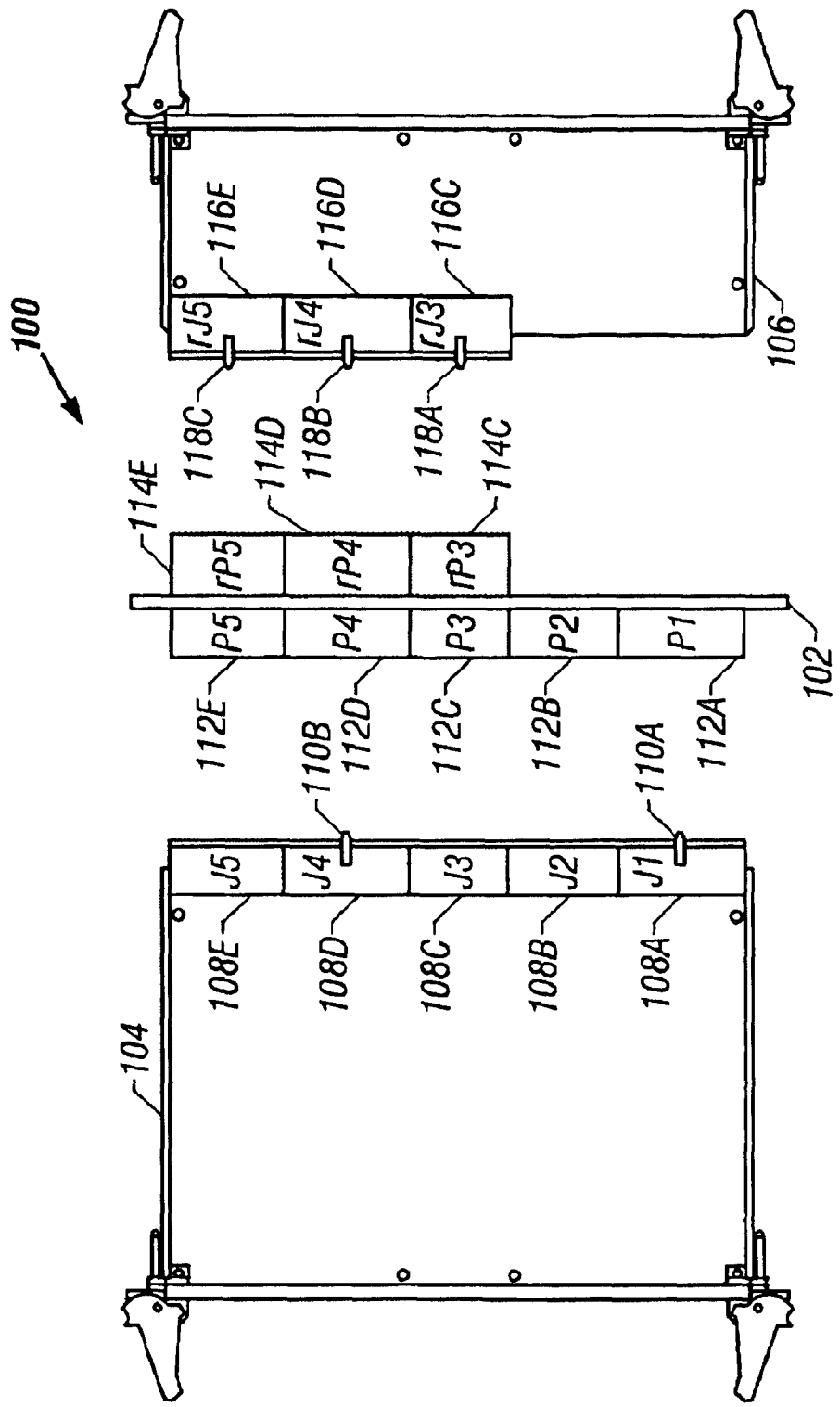
FIG. 1 depicts a CPCI-compliant connector arrangement having a backplane and associated front side and rear side cards.

In the drawings, like or similar elements are designated with identical reference numerals throughout the several views thereof, and the various elements depicted are not necessarily drawn to scale. Referring now to FIG. 1, depicted therein is a conventional CPCI-compliant connector arrangement 100 which is provided as an exemplary backplane system wherein the teachings of the present invention can be advantageously practiced for providing user-defined signal pathways in addition to a standards-based bus system (e.g., CPCI bus). The exemplary connector arrangement 100 includes a CPCI-compliant backplane 102 operable to receive cards from both front and rear sides. Accordingly, a front side card 104 and its corresponding rear side card 106 are provided by way of illustration. As is well-known, CompactPCI® is an adaptation of the Peripheral Component Interconnect (PCI) Specification 2.1 or later for industrial and/or embedded applications requiring a more robust mechanical form factor than desktop PCI. Compact-PCI uses industry standard mechanical components and high performance connector technologies to provide an optimized bus/backplane system intended for rugged applications such as telecommunications equipment.

As a bus standard, CompactPCI is maintained by the PCI Industrial Computer Manufacturers Group (PICMG®). It defines a combination of the electrical and logical specifications of the PCI Standard and the mechanical specifications of the Institute of Electrical and Electronics Engineers (IEEE) 1101 and the International Electromechanical Committee (IEC) 60297 series of standards. For enhanced functionality, two-sided connectorization is provided whereby a backplane supporting a standards-compliant bus is operable to couple to a front side card portion as well as to a rear side card portion associated therewith. The form factor defined for CompactPCI is based on the Eurocard form factor as defined in IEC 60297-3 and IEC 60297-4 and extended by IEEE 1101.10. Typically, the board format is provided as either a 3U (100 mm by 160 mm) or 6U (233.35 mm by 160 mm) Eurocard. For a 3U card, a two-segment connector scheme is specified. That is, each slot on the backplane and the corresponding connector mates on front and rear side cards are segmented into two portions. These segments are conventionally numbered J1 and J2 on the front side card panel, P1 and P2 on the backplane's front side connector slot, rP1 and rP2 on the backplane's rear side connector slot, and rJ1 and rJ2 on the rear side card panel (which is also referred to as a transition module or TM in some applications).

The front side card panel 104 and associated rear side card panel 106 of the connector arrangement 100 exemplify a 6U board format wherein a five-segment connector scheme is provided. Reference numerals 108A through 108E refer to the five connector segments (J1–J5) provided for the front side card panel 104. Similar to the 3U connector scheme, P1 through P5 refer to the corresponding backplane connector portions (reference numerals 112A through 112E) on the front side of the backplane 102. In a typical implementation, J1/P1 and J2/P2 connector segments are operable to support a CPCI standard bus that spans the backplane, which bus interconnects the J1/P1 and J2/P2 segments of the backplane slots. Up to eight slots may be provided, in general, wherein the J1/P1 arrangement is utilized for supporting a 32-bit CPCI bus. A 64-bit, extended CPCI bus arrangement is supported by utilizing both J1/P1 and J2/P2 segments. The remaining connector segments, i.e., J3/P3, J4/P4 and J5/P5 segments, are used for input/output (I/O) signals that traverse from the front side card panel 104 to the rear side card panel 106, which I/O signals are required to be compliant with the applicable CPCI standards. Since no I/O signals traverse from the front side to the rear side using J1/P1 or J2/P2 segments in the exemplary embodiment shown, the backplane 102 is not provided with rear side connector segments rP1 and rP2 that correspond to the P1 and P2 front side segments. Rather, only rP3–rP5 segments (reference numerals 114C–114E) and corresponding rJ3–rJ5 segments (reference numerals 116C–116E) are provided on the backplane's rear side and the real panel, respectively.

Continuing to refer to FIG. 1, the front side card panel 104 and associated rear side card panel 106 may each be provided with one or more alignment features at prescribed locations on the respective connector slots. For instance, reference numerals 110A and 110B refer to two alignment features provided with respect to the front side card panel 104. In similar fashion, three alignment features 118A–118C are provided for the rear side card panel 106.

As is well-known, the alignment features may be provided as part of the connector housings and, depending on connectorization, their location can be specific to one or more of the connector segments. Three housing types are common: Type A, Type B and Type AB. Type A connector segments have alignment features as well as certain coding keys. Type B connector segments are plain and have no such features or keys. Type AB connectors, on the other hand, have alignment features but no coding keys.

Figure 2A:
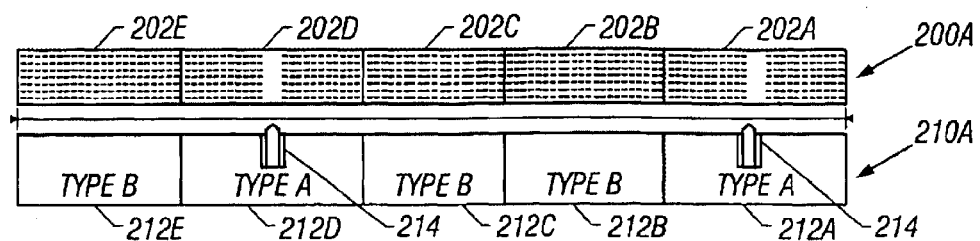
FIGS. 2A and 2B depict two exemplary connectorization schemes available for use with a CPCI backplane.
Figure 2B:
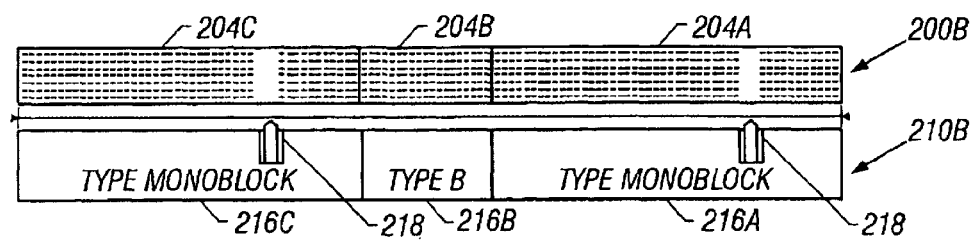

FIGS. 2A and 2B show two exemplary connectorization schemes available for use with a CPCI backplane operable to receive 6U cards. Reference numerals 200A and 200B refer to two backplane slot embodiments, each having a particular connectorization scheme. In the exemplary embodiments shown, not only is the placement of the alignment features variable but two adjacent connector segments may be combined into a single block. Reference numerals 210A and 210B refer to the connector slot housings on the cards that correspond to the backplane slots 200A and 200B.

With respect to the slot arrangement 200A, the five connector segments 202A–202E are separately identified, with segments 202A and 202D having appropriate spaces that accommodate the alignment features 214 of the card connector 210A. Reference numerals 212A–212E refer to the five segments of the card connector 210A, which correspond to the J1–J5 segments discussed above. A Type A connector housing is provided for segments 212A and 212D. A Type B connector housing is provided for remaining three segments.

With respect to the slot arrangement 200B, two top connector segments and two bottom connector segments are combined into separate monoblocks, thereby resulting in only three partitions. Reference numerals 204A–204C refer to the three partitions, wherein each of the partitions 204A and 204C is a combination of two connector segments. The corresponding card connector 210B is accordingly provided with monoblock connector housings 216A and 216C for mating with partitions 204A and 204C, each monoblock having a card alignment feature 218. A Type B connector housing is provided for the segment 216B.

Figure 3:
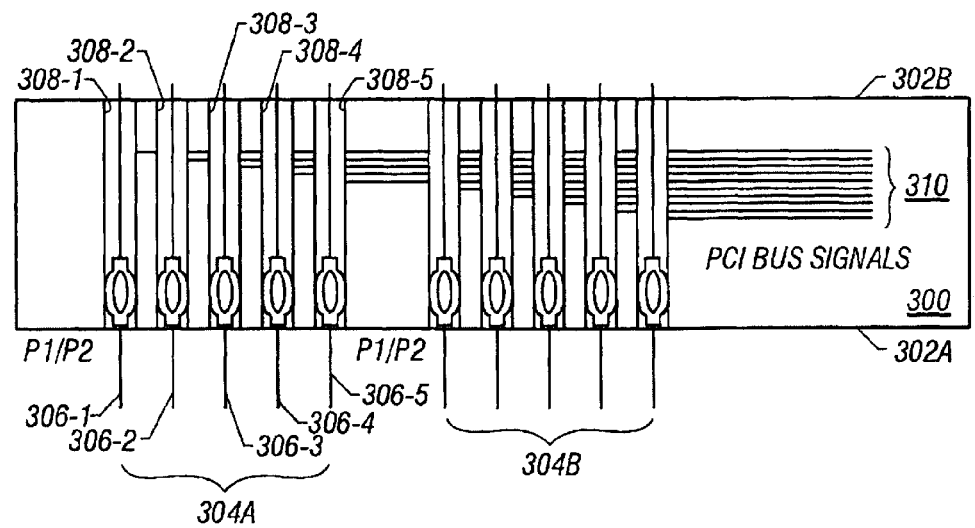
FIG. 3 depicts exemplary P1/P2 connector portions of a CPCI backplane for conventional operation.

Referring now to FIG. 3, shown therein is a top view of a standard backplane 300 having a conventional arrangement of the P1/P2 connector segments. Reference numerals 304A and 304B exemplify the P1/P2 segments of two slots on the backplane 300 having a front side portion 302A and a rear side portion 302B. Each connector segment is 5-contact wide, i.e., it is operable in association with a 5-pin-wide card connector. Reference numerals 306-1 through 306-5 refer to five contact pins having long spills that couple to the corresponding connector holes 308-1 through 308-5 of the backplane 300. As pointed out earlier, the P1/P2 connector segments 304A and 304B support CPCI bus signals carried on a standard bus which is exemplified by a plurality of signal paths 310 interconnecting the slots 304A and 304B.

Conventionally, the entire inner surface of the P1/P2 connector holes may be plated with appropriate conductive material in order to ensure proper electrical contact with the pins. Where necessary, a shroud may be placed on the rear side portion 302B of the backplane 300 in order to couple to the long spills of the contact pins.

Figure 4A:
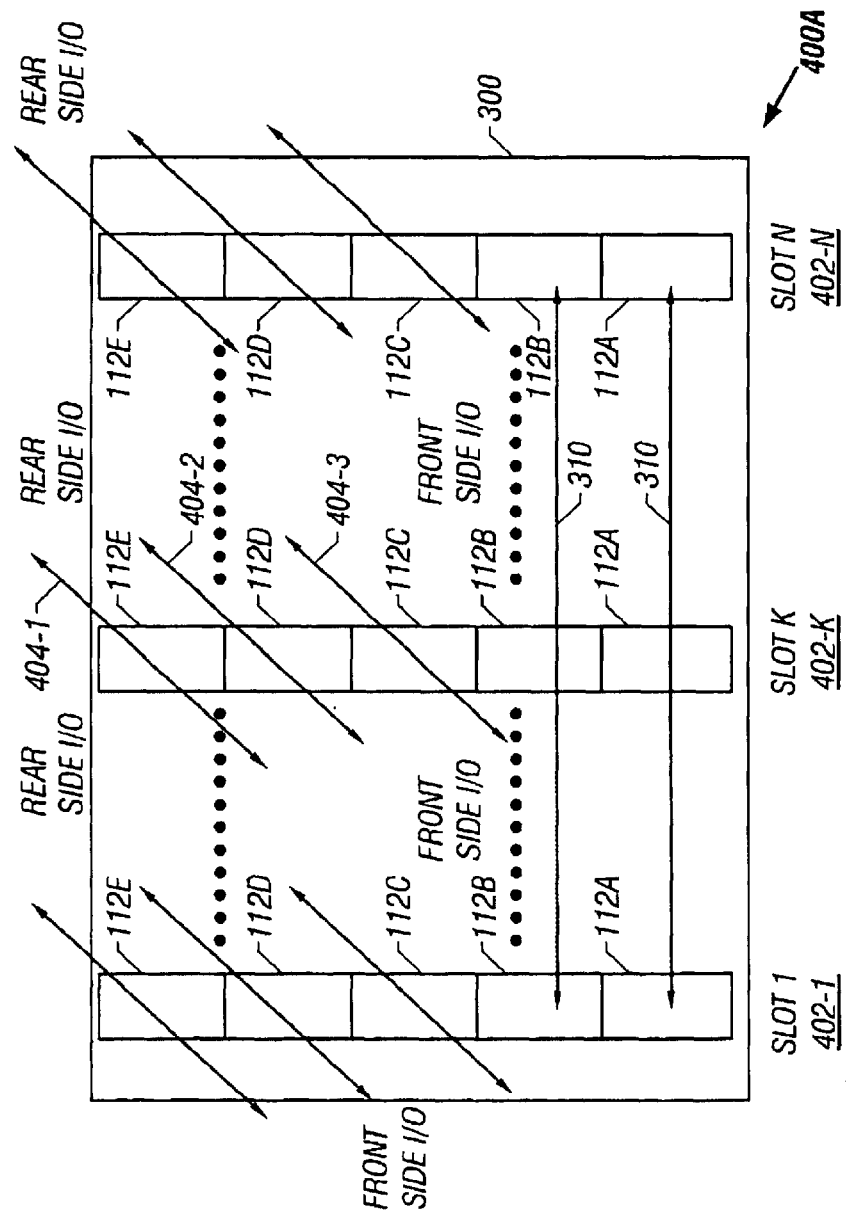
FIG. 4A depicts a high-level signal pathway scheme in a conventional CPCI connector arrangement.

FIG. 4A depicts a high-level signal pathway scheme in a conventional CPCI connector arrangement 400A. A plurality of slots (reference numerals 402-1 through 402-N) are provided on the exemplary CPCI backplane 300. Each slot is preferably provided with the standard P1–P5 connectorization described hereinabove. Reference numeral 310 again refers to the CPCI-compliant bus path that interconnects the P1/P2 segments of the slots for carrying CPCI bus signals. With particular reference to one exemplary slot, Slot K (reference numeral 402-K), three illustrative I/O signal paths 404-1 through 404-3 are disposed between the front side I/O and rear side I/O connectors (i.e., P3/rP3–P5/rP5 segments) of the backplane 300 for carrying CPCI-compliant I/O signals.

Figure 4B:
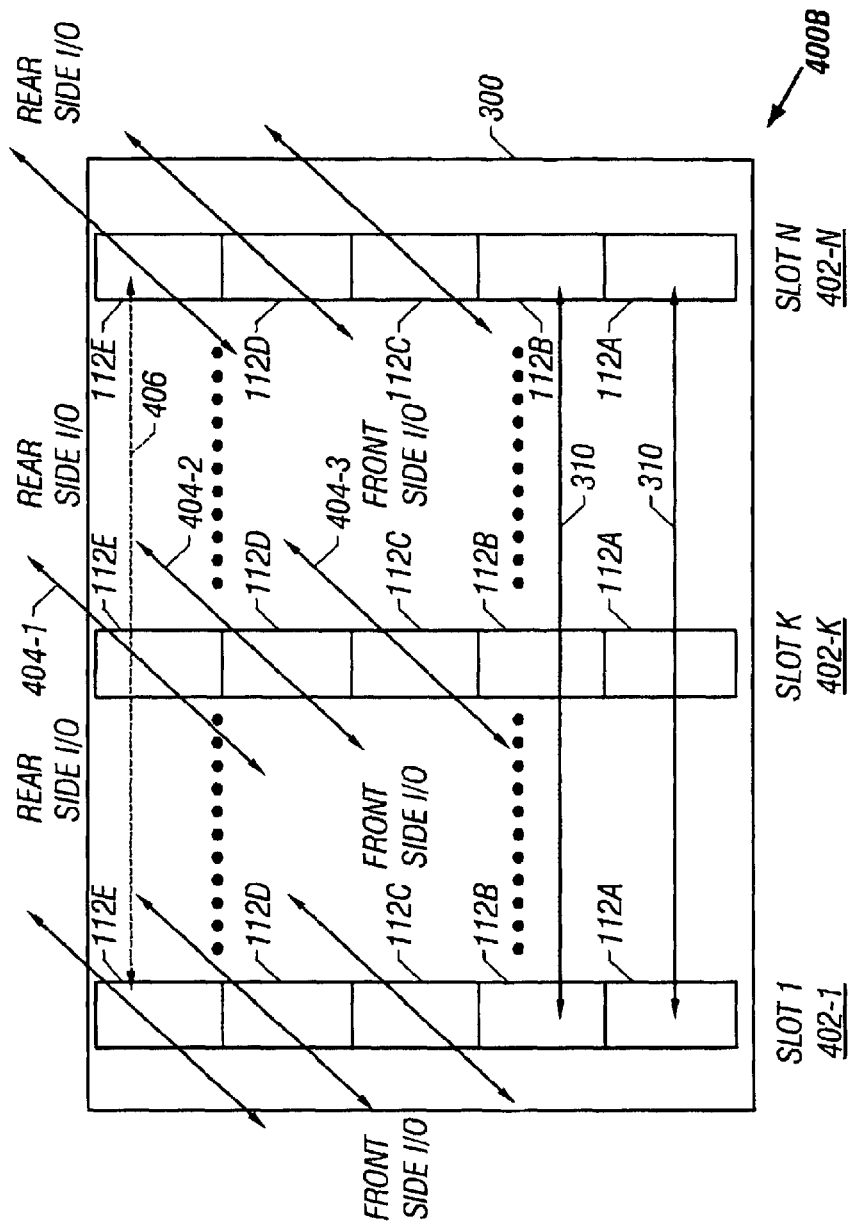
FIG. 4B depicts a conventional solution for providing proprietary signals in a CPCI connector system.

FIG. 4B depicts a conventional solution for providing proprietary signals in a CPCI connector system 400B. As set forth above, the connector system 400B is operable to carry the CPCI-compliant bus signals on the path 310 disposed on the backplane 300. Further, in addition to the standard front-to-rear I/O connectivity, a separate signal path 406 may be provided along the backplane 300 using one of the I/O connectors (i.e., J3/P3 though J5/P5) for carrying one or more user-defined signals (e.g., proprietary signals). However, as pointed out in the Background section of the present patent application, such an arrangement is not satisfactory because it can conflict with the I/O signal space of off-the-shelf CPCI cards.

Figure 5:
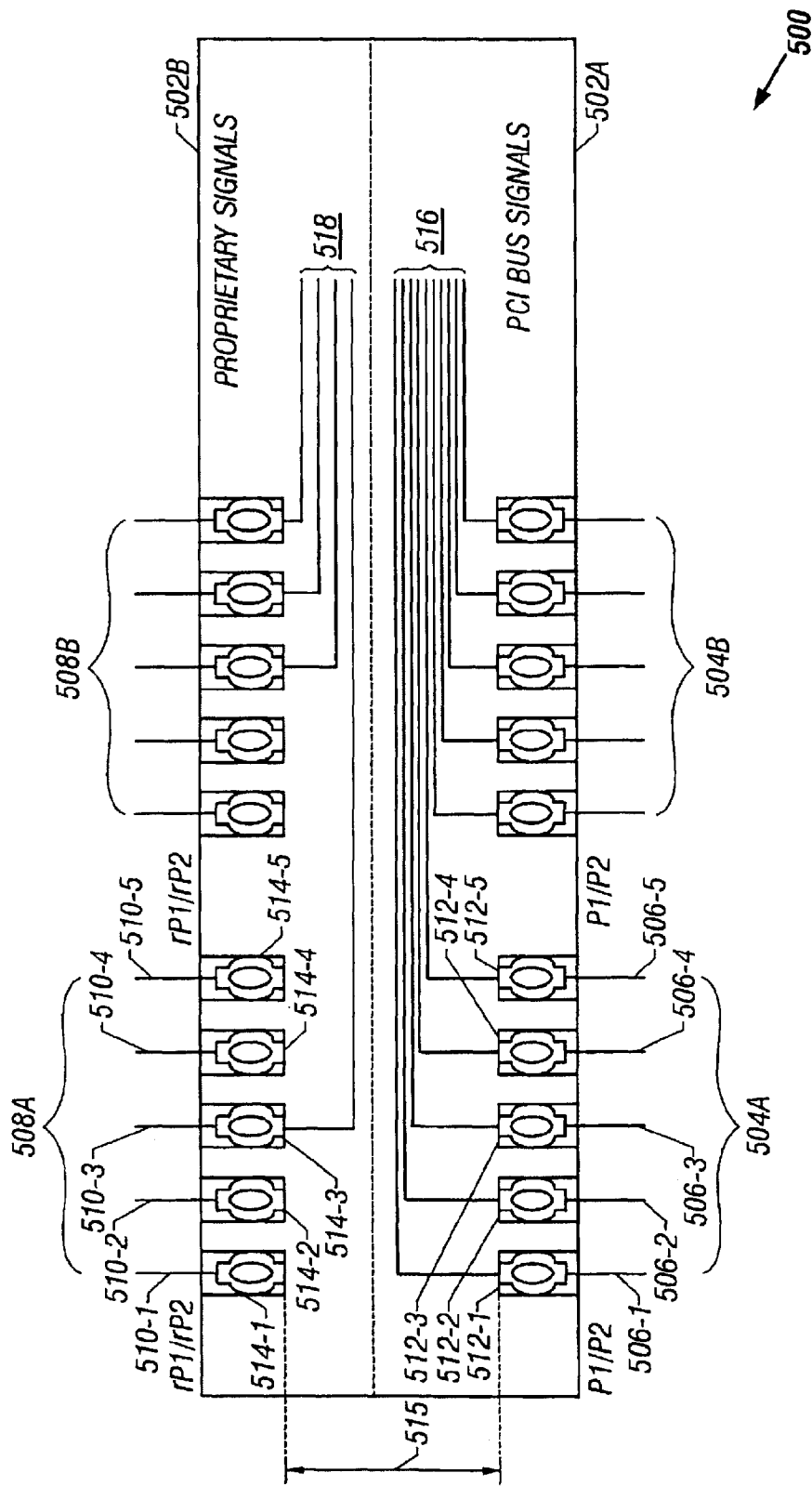
FIG. 5 depicts an exemplary CPCI-compliant backplane for introducing user-defined signals in addition to CPCI bus signals in accordance with the teachings of the present invention.

Referring now to FIG. 5, depicted therein is an exemplary CPCI-compliant backplane 500 for introducing user-defined signals in accordance with the teachings of the present invention. A front side portion 502A is provided with a plurality of front connector holes that are organized into a set of front connector segments, wherein P1/P2 connector segments for two exemplary slots 504A and 504B are illustrated. Connector holes 512-1 through 512-5 exemplify the front connector holes for the P1/P2 connector segments of the present invention that are operable to couple to the corresponding J1/J2 connector contacts 506-1 through 506-5 of a front side card panel (not shown). A rear side portion 502B of the backplane 500 is provided with a plurality of rP1/rP2 connector segments 508A and 508B corresponding to the front side connectors. Each of these rear side connector segments is provided with a set of rear connector holes for coupling with rJ1 and rJ2 portions of a rear side card panel (not shown). For instance, reference numerals 514-1 through 514-5 refer to the rear connector holes of the rP1/rP2 segment 508A, which connector holes are operable to couple to the contacts 510-1 through 510-5 of the corresponding rJ1/rJ2 segment.

In accordance with the teachings of the present invention, the front side connector holes and the rear side connector holes of the P1/P2 and rP1/rP2 segments are electrically separated so that the front side connector segments and the corresponding rear side connector segments are operable to support two independent signal pathways. In a presently preferred exemplary embodiment, the connector holes of the P1/P2 and rP1/rP2 segments are physically separated by a predetermined distance 515 by appropriately dimensioning the connector holes such that ultrashort PCI-compliant contacts may be received therein.

Preferably, signal path 516 provided by interconnecting the front side P1/P2 connector segments of the plural slots is operable to carry the CPCI signals. Similarly, the rear side rP1/rP2 connector segments may be interconnected to form a secondary signal pathway 518 where one or more connector holes of a connector segment may be electrically coupled thereto. The signal pathway 518 is operable to carry proprietary signals on the rear side portion of the backplane 500, which is not used by the standard rear side cards. Accordingly, it should be appreciated that the present invention allows the introduction of one or more user-defined signals in a standard backplane system without compromising the electrical and/or form factor requirements of off-the-shelf boards.

Various proprietary signals may be advantageously carried on the secondary signal bus path created on the backplane of the present invention. In telecom network equipment applications where the present invention may be advantageously employed, e.g., in a signaling server rack, several application-specific system control signals and status signals may be carried on the "split" backplane in addition to the standard CPCI bus signals across a number of line cards. For example, a Super Frame Indicator (SFI) signal operable to control the overall operation of a Next-Generation STP, or an Extended Alarm Signal (EAS) operable to encode the STP's line card alarmlstatus information may be carried on the secondary bus path created in accordance herewith. Additional details regarding these and other related proprietary signals may be found in the following commonly owned co-pending patent application entitled "Clock Distribution Scheme In A Signaling Server," application Ser. No.: 09/541,002, filed Mar. 31, 2000, in the name(s) of: Val Teodorescu, now U.S. Pat. No. 6,643,791, issued Nov. 4, 2003, which patent application has been cross-referenced hereinabove.

Figure 6:
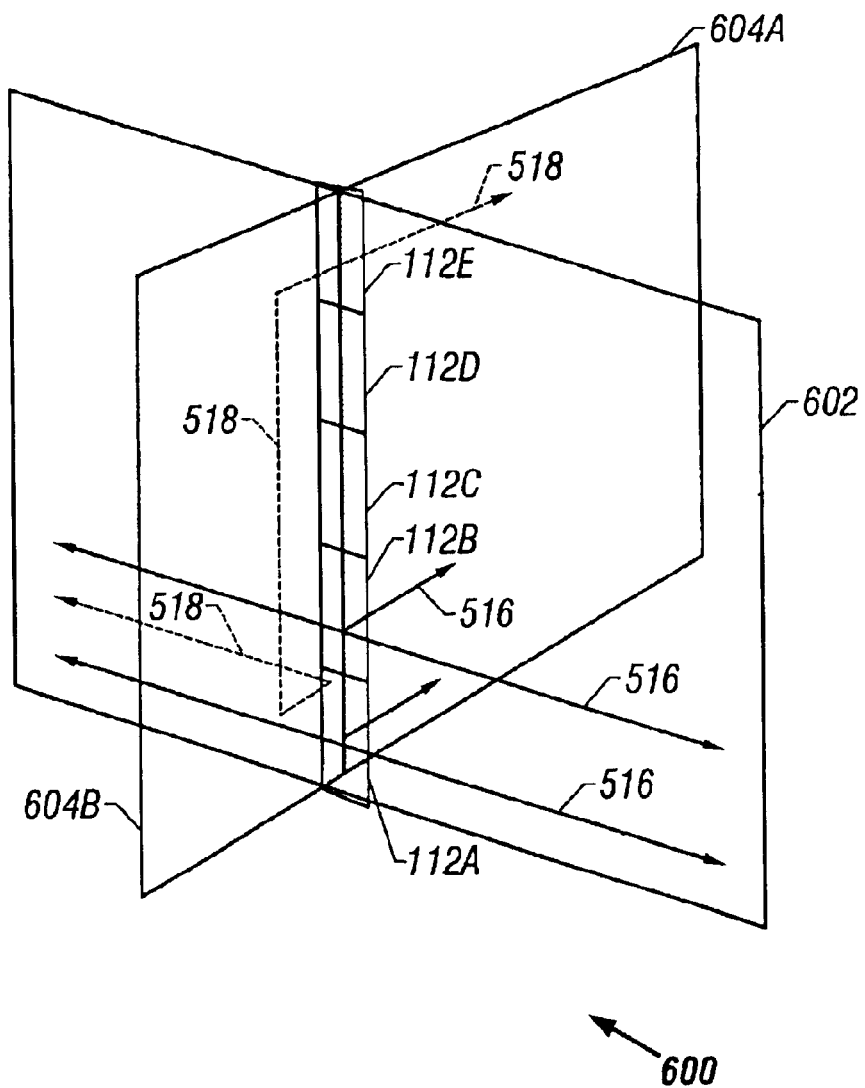
FIG. 6 depicts an exemplary embodiment of a CPCI connector system provided in accordance with the teachings of the present invention.

FIG. 6 depicts an exemplary embodiment of a CPCI connector system 600 provided in accordance with the teachings of the present invention. Reference numeral 602 refers to a backplane having a split connectorization for its P1 segment 112A, P2 segment 112B, or both, as set forth above. Reference numerals 604A and 604B refer to exemplary front side and rear side card panels, respectively. Standard PCI signals are operable to be carried on the CPCI bus 516 supported by the front P1/P2 segments. The proprietary signals may be carried on the secondary bus 518 on the rear side (i.e., rP1 and/or rP2 segments) of the backplane 602, which signals can traverse the rear side card 604B and be provided to the front side card 604A via a standard I/O connector segment, e.g., rP5/P5 segment 112E.

Based upon the foregoing Detailed Description, it should be apparent that the present invention advantageously provides an innovative and efficient solution for introducing user-defined signals in a standard CPCI backplane system without precluding the use of standard third-party CPCI cards. By providing such capability in a telecom application environment, the design and performance of network equipment can be greatly enhanced.

It is believed that the operation and construction of the present invention will be apparent from the foregoing Detailed Description. While the exemplary embodiments of the invention shown and described have been characterized as being preferred, it should be readily understood that various changes and modifications could be made therein without departing from the scope of the present invention as set forth in the following claims. For instance, although the teachings of the present invention have been particularly exemplified in a CPCI connector environment, those skilled in the art should recognize that user-defined signals may be introduced in any standards-compliant backplane system in accordance herewith. Thus, the teachings of the present invention are amenable for practice with respect to such applications as VME, MultiBus and Eurocard systems, in addition to 9U-based CPCI applications. Further, the electrical separation between the front and rear connector holes of a standards-compliant backplane may be effectuated by any known or heretofore unknown means, wherein actual physical separation is one exemplary implementation. In other embodiments, for instance, the holes may be continuous front-to-rear (i.e., feed-through holes), but may have electrical separation by way of insulated inner wall portions. In still further embodiments, there may be a "spacer" sandwiched between the front and rear side portions of the backplane. It should therefore be understood that these and other various modifications, alterations, revisions, amendments, additions, deletions, combinations, and the like are within the ambit of the present invention whose scope is limited solely by the following claims.

What is claimed is:

1. A connector system, comprising:
   a Compact Peripheral Component Interconnect (CPCI)-compliant backplane having a plurality of slots, each slot including five front side connector segments (denoted herein as P1 through P5) and five rear side connector segments (denoted herein as rP1 through rP5) that correspond to said front side connector segments, wherein connector holes forming said rP1 and rP2 connector segments correspond to connector holes forming said P1 and P2 connector segments but are electrically separated therefrom;
   a front side card coupled to said backplane at a particular slot, said front side card operating to carry a plurality of CPCI signals via a front side backplane bus formed to couple said P1 and P2 connector segments of said slots; and
   a rear side card coupled to said backplane at said particular slot's rear side connector segments, said rear side card operating to carry at least one user-defined signal via a rear side backplane bus formed to couple said rP1 and rP2 segments of said slots.

2. The connector system as set forth in claim 1, wherein said at least one user-defined signal is provided from said rear side card to said front side card via a coupling from between said P3 and rP3 connector segments.

3. The connector system as set forth in claim 1, wherein said at least one user-defined signal is provided from said rear side card to said front side card via a coupling from between said P4 and rP4 connector segments.

4. The connector system as set forth in claim 1, wherein said at least one user-defined signal is provided from said rear side card to said front side card via a coupling from between said P5 and rP5 connector segments.

5. The connector system as set forth in claim 1, wherein said at least one user-defined signal comprises a Super Frame Indicator (SFI) signal operable to control the operation of a telecommunications rack in which said backplane is deployed.

6. The connector system as set forth in claim 1, wherein said at least one user-defined signal comprises an Extended Alarm Signal (EAS) operable to carry a plurairty of alarms generated in the operation of a telecommunications rack in which said backplane is deployed.

7. The connector system as set forth in claim 1, wherein said connector holes forming said P1 and P2 connector segments are dimensioned to receive ultrashort press-in pins formed at a corresponding connector portion of said front side card.

8. The connector system as set forth in claim 7, wherein said connector holes forming said rP1 and rP2 connector segments are dimensioned to receive ultrashort press-in pins formed at a corresponding connector portion of said rear side card.

9. The connector system as set forth in claim 1, wherein an insulating layer is disposed between said connector holes forming said P1 and P2 connector segments and said connector holes forming said rP1 and rP2 connector segments.

10. The connector system as set forth in claim 1, wherein a physical separation of a predetermined distance is disposed between said connector holes forming said P1 and P2 connector segments and said connector holes forming said rP1 and rP2 connector segments.

* * * * *